United States Patent [19]

Odom et al.

[11] Patent Number: 5,678,063

[45] Date of Patent: Oct. 14, 1997

[54] SYSTEM AND METHOD FOR PERFORMING EFFICIENT RANDOM WRITE OPERATIONS

[75] Inventors: Brian Keith Odom, Travis County; Robert Canik, Cedar Park, both of Tex.

[73] Assignee: National Instruments Corporation, Austin, Tex.

[21] Appl. No.: 423,469

[22] Filed: Apr. 19, 1995

[51] Int. Cl.⁶ .................................................. G06F 13/00
[52] U.S. Cl. ............................................ 395/842; 395/872
[58] Field of Search .................................. 395/250, 872, 395/842, 843, 846

[56] References Cited

U.S. PATENT DOCUMENTS

| | | | |
|---|---|---|---|
| 4,707,834 | 11/1987 | Frisch et al. | 395/183.07 |
| 4,847,750 | 7/1989 | Daniel | 395/846 |
| 5,263,142 | 11/1993 | Watkins et al. | 395/842 |
| 5,499,384 | 3/1996 | Lentz et al. | 395/821 |

OTHER PUBLICATIONS

*MC689440, Dual–Channel Direct Memory Access Controller*, Motorola Semiconductor Products Inc., Austin, Texas, Feb., 1984, pp. 1–10 through 8–4, Foldout 1–8.

Primary Examiner—Parshotam S. Lall
Assistant Examiner—Viet Vu
Attorney, Agent, or Firm—Conley, Rose & Tayon; Jeffrey C. Hood

[57] ABSTRACT

A system and method for rapidly transferring large amounts of small-sized data to non-sequential addresses in an instumentation system. According to a preferred embodiment, a host computer includes a plurality of test vectors stored in memory which control the operation of attached instruments. The host processor generates a block of address/data pairs in response to the test vectors, with each pair containing data and a destination address. This block is stored in memory and the address of the block is provided to a random write engine. The random write engine then distributes the data to the respective instruments at the proper addresses with minimal processor invention. Therefore, large amounts of small-sized data may be rapidly transferred to non-sequential addresses without burdening the processor.

19 Claims, 6 Drawing Sheets

EXPANSION/MXI CARD 108

VXI — MXI EXTENDER

SYSTEM AND METHOD FOR PERFORMING EFFICIENT RANDOM WRITE OPERATIONS

FIELD OF THE INVENTION

The present invention pertains to I/O transfers between a host computer and a peripheral device, and more particularly to the high speed transfer of large amounts of data to non-sequential addresses.

DESCRIPTION OF THE RELATED ART

Direct Memory Access (DMA) methods allow a device to quickly transfer data directly to or from the computers main memory without processor intervention. Ordinarily, the processor controls the main memory and provides the necessary address and control signals for each transfer that takes place. However, in a DMA transfer, a DMA transfer device or DMA controller operates by temporarily controlling the transfer of data directly between a device and main memory.

During normal DMA operation, the processor sends the DMA transfer device a source address for a block of data, a destination address, and the length of the block, all in one command. Based on that command, the DMA transfer device accesses the data to be transferred at the source address, and transfers the entire block of data to the destination address. This process only requires one instruction from the processor, and the processor is free to perform other operations during the transfer. However, if the DMA transfer device is required to access data that is not stored as a sequential block in memory, or if the DMA transfer device is required to transfer data to non-sequential destinations, the processor must send a new command for each new non-sequential memory location. Therefore, the DMA transfer device is able to rapidly transfer large blocks of data only if the data is stored sequentially in memory or is being transferred to sequential locations in memory.

In many instrumentation and test and measurement applications, the various instruments and/or lab equipment are required to provide large amounts of data representing numerous measurements to a computer for processing. In addition, large test vectors are typically provided from the computer to the instruments to control the precise tests performed by the instruments. The large test vectors are typically stored as one-dimensional or two-dimensional matrices. Typically, a computer will have a plurality of test vectors stored in memory, with each vector occupying several sequential memory address spaces. These large test vectors are generally provided one at a time via pins to the various instruments in order to perform the desired tests and measurements. Normally, a DMA controller is used to transfer these vectors in order to remove this burden from the processor. However, due to the size and number of these vectors, the transfer is typically a slow process because of the sheer volume of data involved. Any increase in speed will therefore lead to a highly desirable improvement in the efficiency of the entire system.

One technique used for storing a sequence of large test vectors is to use sparse matrices. Usually, the differences between two sequential test vectors are minor, i.e., only a few elements of the vectors may be different. In this case, instead of storing each full vector it is efficient to build a plurality of sparse matrices, or difference matrices, wherein each sparse matrices contains only the differences between the respective vector and a prior vector. A typical implementation of a sparse matrix technique is as follows. First, a complete test vector is stored in memory. Subsequent vectors are then read from memory by the processor, the processor compares these subsequent vectors to the first vector, and sparse matrices are generated which represent the differences between the respective two vectors. Each sparse matrix stores only the differing element from the subsequent vector and the first vector. Alternatively, each of the sparse matrices may be generated "on the fly" during the test and measurement application.

The use of sparse matrices reduces the amount of data required to be transferred and thus allows for more efficient transfers. However, the use of sparse matrices entails that small amounts of data are required to be transferred to non-sequential locations. As discussed above, if data transfers are to non-sequential locations, a new destination address is required for every piece of data. Because the DMA transfer device is no longer able to independently transfer the data, the processor consumes valuable time controlling this function.

Therefore, a problem with DMA data transfers is the inability to efficiently transfer large amounts of data to non-sequential addresses. This makes it unfeasible to represent test vectors as sparse matrices to allow more efficient vector representation. Therefore, it is desirable to have the capability to efficiently transfer differences between vectors, i.e., sparse matrix vectors instead of complete vectors, to increase the performance of test and measurement applications in an instrumentation system. Accordingly, a system and method is desired which can rapidly transfer large amounts data to non-sequential addresses with minimum processor intervention.

Similar problems are encountered in graphics environments where full motion video is desired. Computers with sophisticated graphics capabilities rely on high speed transfers of large amounts of pixel data in order to represent realistic graphic images. In a full motion video sequence, each screen image is represented by a large block of pixel data. New images or frames are continually refreshed or redrawn, faster than the eye can detect, with new blocks of pixel data so that the user only sees a continuous picture. Because an image does not change dramatically from one frame to the next in full-motion video, it is generally more efficient to only redraw the parts of the image that have changed with respect to the immediately prior frame or a prior key frame, as opposed to redrawing the entire screen. However, a problem with redrawing only the changes to a frame is how to efficiently transfer new data to non-sequential addresses in the image that need updating. Because the data is generally being transferred to non-sequential addresses, a DMA transfer device would require a large amount of involvement from the main processor, thus adversely affecting system performance.

SUMMARY OF THE INVENTION

The present invention comprises a direct memory access system and method for rapidly transferring large amounts of small-sized data to non-sequential addresses. According to the present invention, a processor generates a block of address/data pairs, with each pair containing a data word and a destination address. This block is stored in memory, and the address of the block is provided to a random write engine in a DMA transfer device. The random write engine then distributes the data to peripherals or instruments at the proper addresses without interfering with the operation of the processor. Therefore, large amounts of small-sized data may be rapidly transferred to non-sequential addresses with decreased processor involvement.

The preferred embodiment comprises a computer-controlled instrumentation system. The computer system includes a host CPU and memory storing test matrix vectors which control the operation of attached instruments. Because sequential vectors are substantially similar, it is easier to represent respective vectors by the differences between the respective vector and a prior vector in a sparse matrix form, wherein the sparse matrix is much smaller than a full test vector. However, transferring only the differences between two vectors requires transferring a large amount of small-sized data to non-sequential addresses. Random write logic according to the present invention performs these non-sequential transfers.

The random write logic according to the preferred embodiment operates as follows. First, the host processor accesses the test vectors in memory and generates sparse matrix vectors for respective vectors. The host processor then creates a block of address/data pairs representing the data to be transferred. The processor then programs the DMA transfer logic into random write mode to enable the random write engine according to the present invention. The random write engine is specifically designed to properly handle the specially formatted block of address/data pairs. The host CPU then writes the address and the length of the block of address/data pairs to the random write engine.

The random write engine includes a DMA load engine for receiving the block of address/data pairs and a DMA transfer engine for transferring the data to the non-sequential destination addresses. After receiving the address and length of the block of address/data pairs, the load engine reads the block into a first-in first-out queue (FIFO). The random write engine then pulls address/data pairs one at a time from the FIFO and stores the address portion of the pair in an address register and stores the data portion of the pair in a data register. This alternating process of splitting a pair into an address register and data register is preferably controlled by two alternating latch signals coupled to the address register and the data register. The first latch signal is asserted to the address register to load the address from the FIFO into the address register, and the second latch signal is asserted to the data register to load the data from the FIFO into the data register. The latching signals preferably alternate with each clock cycle so that the address and data portions of each address/data pair are loaded into the address register and data register, respectively. Once an address and the corresponding data are stored in the address register and the data register, the data contained in the data register is transferred to the respective instrument at the address contained in the address register. The random write engine continues this sequence, loading the address and data registers and transferring data to the respective instrument, until the entire block of address/data pairs has been transferred.

In this manner, the present invention comprises a system and method for rapidly transferring large amounts of small-size data to non-sequential addresses with minimal host CPU involvement. The present invention therefore allows for efficient transfers of test vectors in an instrumentation system.

BRIEF DESCRIPTION OF THE DRAWINGS

A better understanding of the present invention can be obtained when the following detailed description of the preferred embodiments is considered in conjunction with the following drawings, in which.

DETAILED DESCRIPTION OF THE PREFERRED EMBODIMENT

Figure 1:
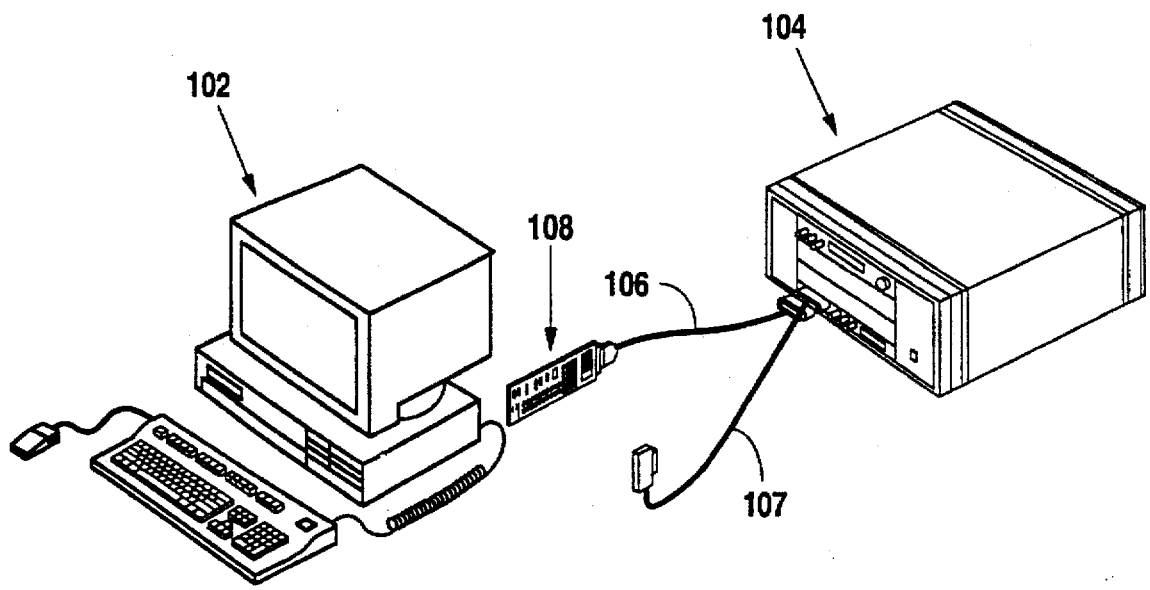
FIG. 1 illustrates an instrumentation system controlled by an external computer.

Referring now to FIG. 1, an instrumentation system incorporating the system and method of the present invention is shown. The present invention is preferably incorporated into an instrumentation system. However, it is noted that the present invention may be incorporated into other systems as desired. The instrumentation system shown in FIG. 1 includes an external computer 102 preferably comprising a system unit, monitor, keyboard, and mouse, as shown. In the embodiment shown in FIG. 1, the external computer 102 includes an expansion bus, preferably based on the industry standard architecture (ISA), also referred to as the AT bus. It is noted that other expansion buses may be used as desired. The external computer 102 includes an interface card referred to as the AT-MXI interface card 108 (shown outside of the external computer for illustrative purposes) which interfaces between the expansion bus in the external computer 102 and a MXI bus implemented on MXI cable 106. The AT-MXI interface card 108 translates between AT bus signals in the external computer 102 and MXI bus signals in the MXI cable 106. The external computer 102 is coupled to a VXI mainframe 104 through the MXI cable 106.

The VXI mainframe 104 includes a first VXI-MXI extender card (230 FIG. 3) which receives MXI signals from the MXI cable 106 and translates these signals into VXI signals which are supplied to the VXI backplane or bus built into the VXI mainframe 104. A plurality of VXI instruments are preferably comprised within the VXI mainframe 104 connected to the VXI backplane. The VXI instruments preferably utilize pin drive electronics. Therefore, the external computer 102 controls VXI instruments in the VXI mainframe 104 by generating signals across the expansion bus through the AT-MXI interface 108, the MXI cable 106, and to the VXI-MXI extender inside the VXI mainframe 104. The VXI-MXI extender converts the respective signals into VXI signals, which are then used to control the VXI instruments. The VXI mainframe 104 may also include a second VXI-MXI extender (230A FIG. 3) which connects to a second MXI cable 107 that is used for connecting to other VXI mainframes as shown. In this manner, a plurality of VXI mainframes 104 can be daisy-chained together to allow the external computer 102 to control a greater number of VXI instruments.

Figure 2:
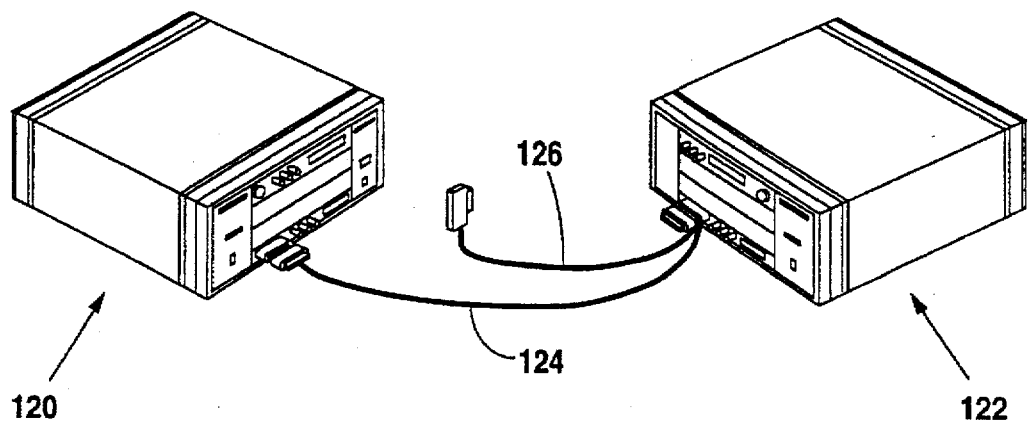
FIG. 2 illustrates an instrumentation system comprising two VXI mainframes controlled by an embedded CPU.

Referring now to FIG. 2, an alternate embodiment which implements the system and method of the present invention is shown. In the system shown in FIG. 2, an external computer is not used to control the instrumentation system, but rather a first VXI mainframe 120 includes an embedded CPU resource manager which controls VXI instruments in the first VXI mainframe 120 and also controls VXI instruments in a second VXI mainframe 122. The first VXI mainframe 120 includes a VXI-MXI extender (not shown) which translates VXI signals into MXI signals that are transferred over MXI cable 124 to the second VXI mainframe 122. The second VXI mainframe 122 includes a VXI-MXI extender (not shown) which translates the MXI signals into VXI signals that are provided over the VXI backplane to control the respective VXI instruments in the second VXI mainframe 122. In this manner, the embedded CPU resource manager inside the first VXI mainframe 120 controls VXI instruments in both the first and second VXI mainframes 120 and 122. Also, the second VXI mainframe 122 may include a second VXI-MXI extender (not shown) which connects to an additional MXI cable 126 that can connect to a third VXI mainframe (not shown) as desired. In this manner, any number of VXI mainframes can be daisy-chained together to allow the embedded CPU resource manager in the first VXI mainframe 120 to control any number of VXI instruments.

Figure 3:
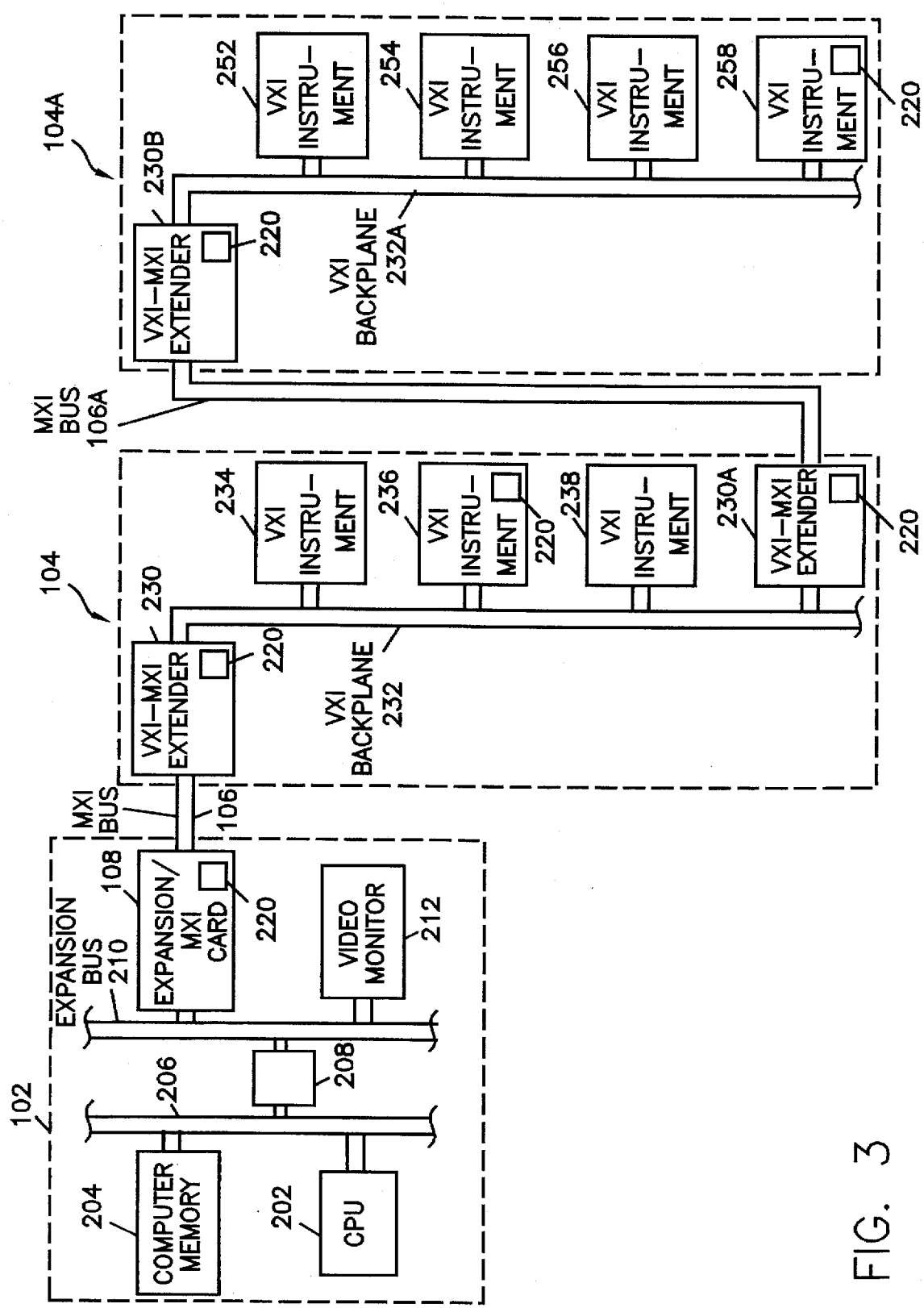
FIG. 3 is a block diagram of the instrumentation system of FIG. 1.

Referring now to FIG. 3, a block diagram illustrating the components comprising the instrumentation system in FIG. 1 is shown. As shown, the external computer 102 includes a CPU 202 and computer memory 204 connected to a system bus 206. The system bus 206 is connected through a bus interface 208 to an expansion bus 210. The expansion bus 210 can be based on any of the various types of bus standards, including the industry standard architecture (ISA), referred to as the AT bus, the extended industry standard architecture (EISA), microchannel architecture (MCA), and the NuBus, as well as others. Alternatively, the expansion bus may be a CPU local bus, such as the PCI (peripheral component interconnect) bus or the VL bus. A video monitor 212 is preferably coupled to the expansion bus 210. The expansion/MXI card 108 is preferably coupled to the expansion bus 210. As discussed above with regard to FIG. 1, the expansion bus used in the embodiment in FIG. 1 is the AT bus, and the expansion/MXI card is the AT-MXI interface card 108. As shown, the expansion/MXI interface card 108 includes direct memory access (DMA) transfer logic 220 which includes a random write engine according to the present invention.

The expansion/MXI card 108 couples through the MXI bus over a MXI cable 106 to a VXI-MXI extender 230. The VXI-MXI extender 230 is coupled to a VXI backplane 232. A plurality of VXI instruments 234, 236, and 238 are preferably coupled to the VXI backplane as shown. As mentioned above, the VXI instruments 234, 236 and 238 preferably utilize pin drive electronics. The VXI-MXI extender 230 translates MXI signals received from the MXI bus 106 into VXI signals that are provided over the VXI backplane 232 and vice-versa. The VXI-MXI extender 230 preferably includes DMA transfer logic 220 according to the present invention, which is similar to the DMA transfer logic 220 in the expansion/MXI card 108. One or more of these VXI instruments, such as the VXI instrument 236, may also include DMA transfer logic 220 comprising a random write engine according to the present invention. As discussed above, the random write engine controls high speed transfers of data to non-sequential addresses.

In one embodiment of the invention, the VXI mainframe 104 includes a second VXI-MXI extender 230A which couples through a second MXI cable 106A to a second VXI mainframe 104A. The second VXI mainframe 104A includes a third VXI-MXI extender 230B which connects to the MXI bus 106A. The VXI-MXI extender 230B connects to a VXI backplane 232A. A plurality of VXI instruments 252, 254, 256, and 258 are connected to the VXI backplane 232A. The third VXI-MXI extender 230B preferably includes a random write engine in the DMA transfer logic 220 according to the present invention. One or more of the VXI instruments 252–258, such as the instrument 258, may also include a random write engine according to the present invention. It is noted that further VXI mainframes can be daisy-chained in this fashion, as desired.

Figure 4:
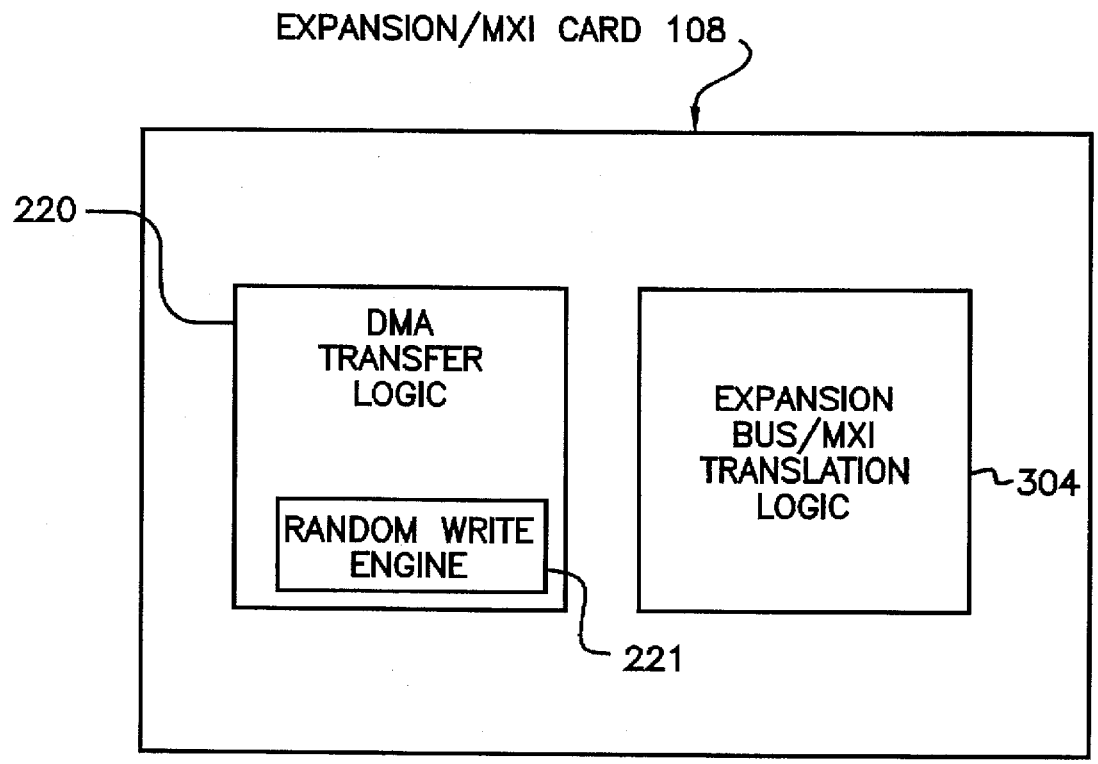
FIG. 4 is a block diagram of the expansion/MXI card in the block diagram of FIG. 3.

Referring now to FIG. 4, a block diagram illustrating elements comprised in the expansion/MXI card 108 is shown. As shown, the expansion/MXI card 108 includes the DMA transfer logic 220 with a random write engine 221, and the card 108 also includes expansion/MXI translation logic 304. As discussed above, the random write engine 221 in the DMA transfer logic 220 performs data transfers to non-sequential addresses according to the present invention. The expansion/MXI translation logic 304 converts signals between the expansion bus 210 and the MXI bus 106.

Figure 5:
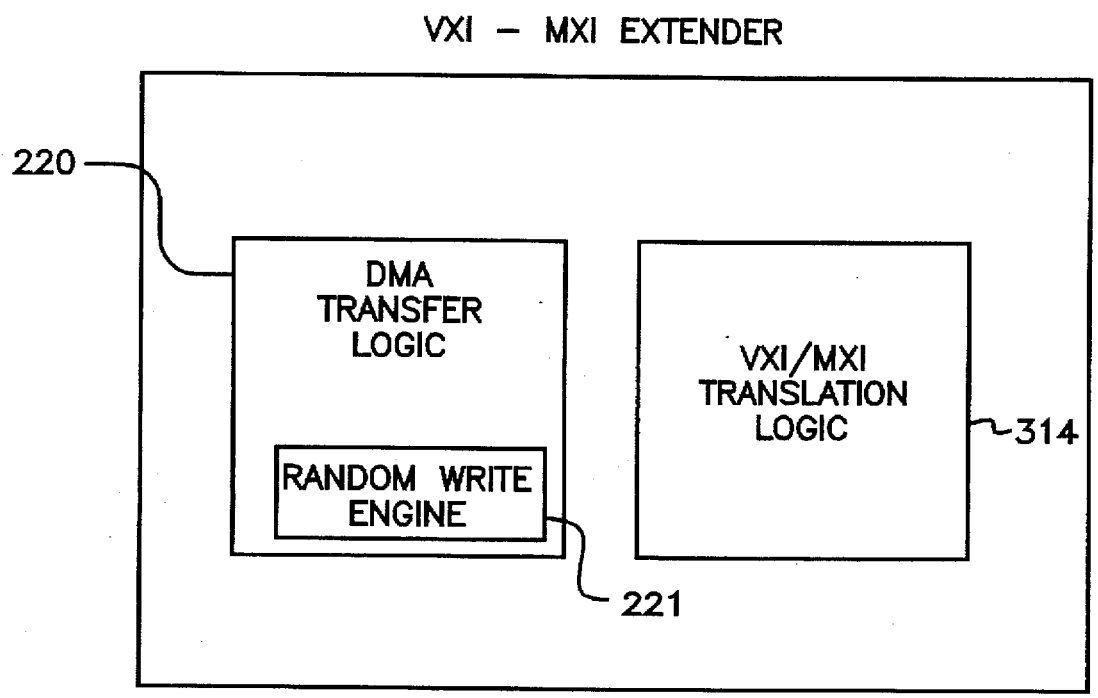
FIG. 5 is a block diagram of the VXI-MXI extender in the block diagram of FIG. 3.

Referring now to FIG. 5, a block diagram illustrating the components in each of the VXI-MXI extenders 230, 230A, and 230B are shown. In the preferred embodiment, the VXI-MXI extenders 230, 230A, and 230B are identical. As shown, each VXI-MXI extender includes DMA transfer logic 220 with a random write engine 221, and also VXI-MXI translation logic 314. As discussed above, the random write engine 221 of the DMA transfer logic 220 performs data transfers to non-sequential addresses according to the present invention.

Referring again to FIGS. 1 and 3, in the preferred embodiment, direct memory access (DMA) transfer logic 220 according to the present invention is included on the AT-MXI interface card 108, one or more of the VXI-MXI extenders 230, 230A, and 230B in the VXI mainframes 104 and 104A, and one or more of the VXI instruments such as instruments 236 and 258. This logic includes a random write engine according to the present invention which rapidly and efficiently transfers large amounts of small-sized data to non-sequential addresses.

The present invention operates by first building a block of address/data pairs which comprises pairs of respective data and the corresponding destination address of the data. The CPU 202 then programs the DMA transfer logic 220 to enable its random write engine 221 and writes the address of this block to the random write engine 221. The random write engine in the DMA logic 220 reads the block of address/data pairs and transfers the data to the appropriate addresses, one address/data pair at a time. Since the random write engine 221 performs the transfer, the host CPU 202 is only required to set up the address/data pairs, enable the random write engine 221, and write the address of the block to the DMA transfer logic 220 to initiate the transfer. Since the random write engine controls the data transfers, this frees up the host CPU 202, thus increasing system efficiency.

Figure 6:
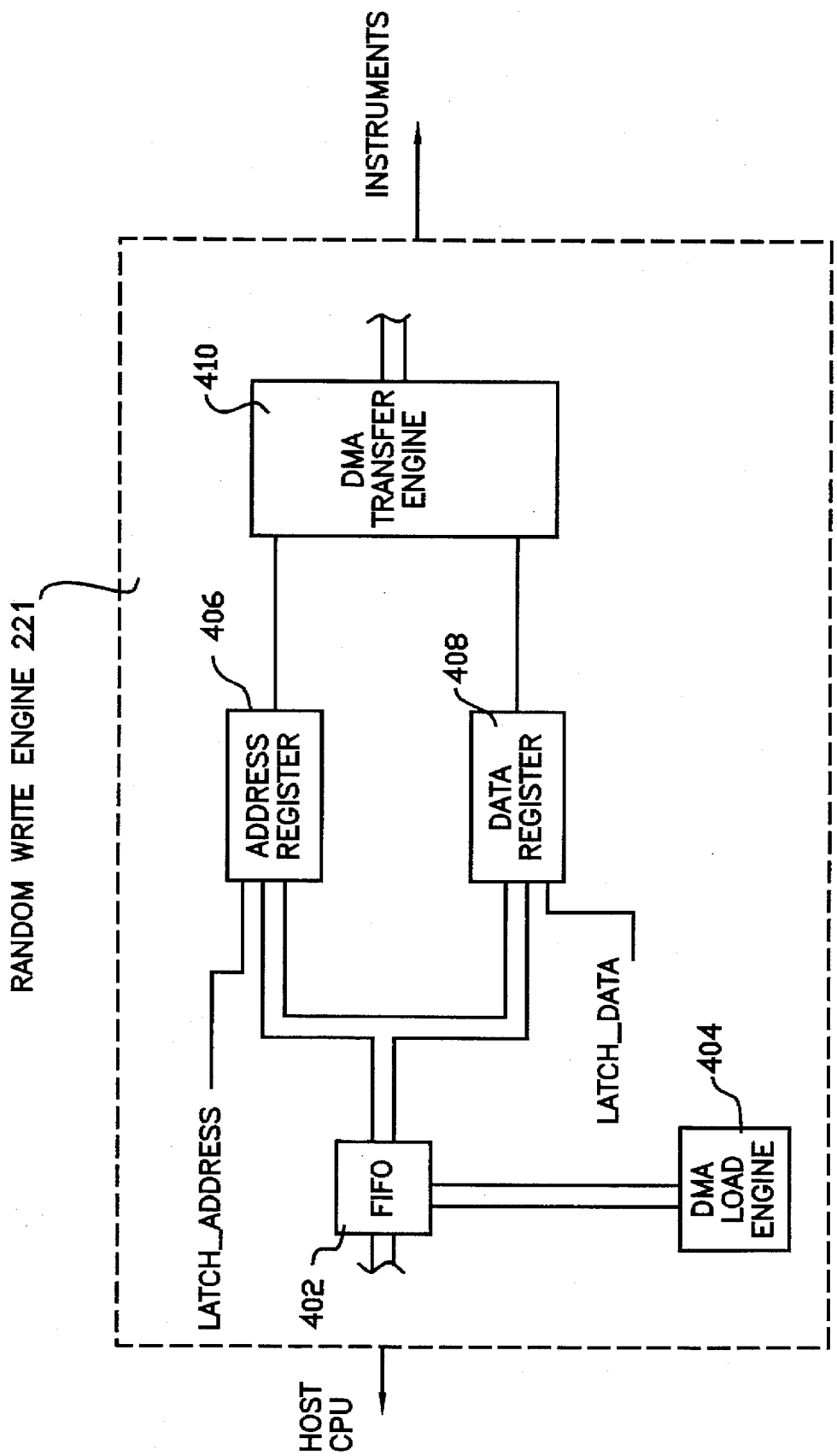
FIG. 6 is a block diagram of the random write engine according to the present invention.

FIG. 6 illustrates the preferred embodiment of the random write engine 221 according to the present invention. A DMA load engine 404 is coupled to a first-in, first-out buffer (FIFO) 402 which receives a block of address/data pairs from the host CPU 202. The DMA load engine 404 controls the operations of the FIFO 402. An address register 406 and a data register 408 are connected to the FIFO buffer 402. The address register 406 stores the address portion and the data register 408 stores the data portion of an address/data pair. The registers 406 and 408 are preferably 32-bit registers, although other sizes are also contemplated. Two latching signals referred to as Latch_Address and Latch_Data control the transfer of data from the FIFO 402 into the address register 406 and the data register 408, respectively. The latching signals are alternately asserted with every clock cycle to latch elements from the FIFO 402 and alternatively store these elements in either the address register 406 or the data register 408. The latching signals operate so that the address portion of an address/data pair is loaded into the address register 406 and the data portion of the address/data pair is loaded into the data register 408. A DMA transfer engine 410 is connected to the address register 406 and the data register 408 and operates to transfer the data from the data register 408 to the respective instrument connected to the computer system at the corresponding address contained in the address register 406.

Figure 7:
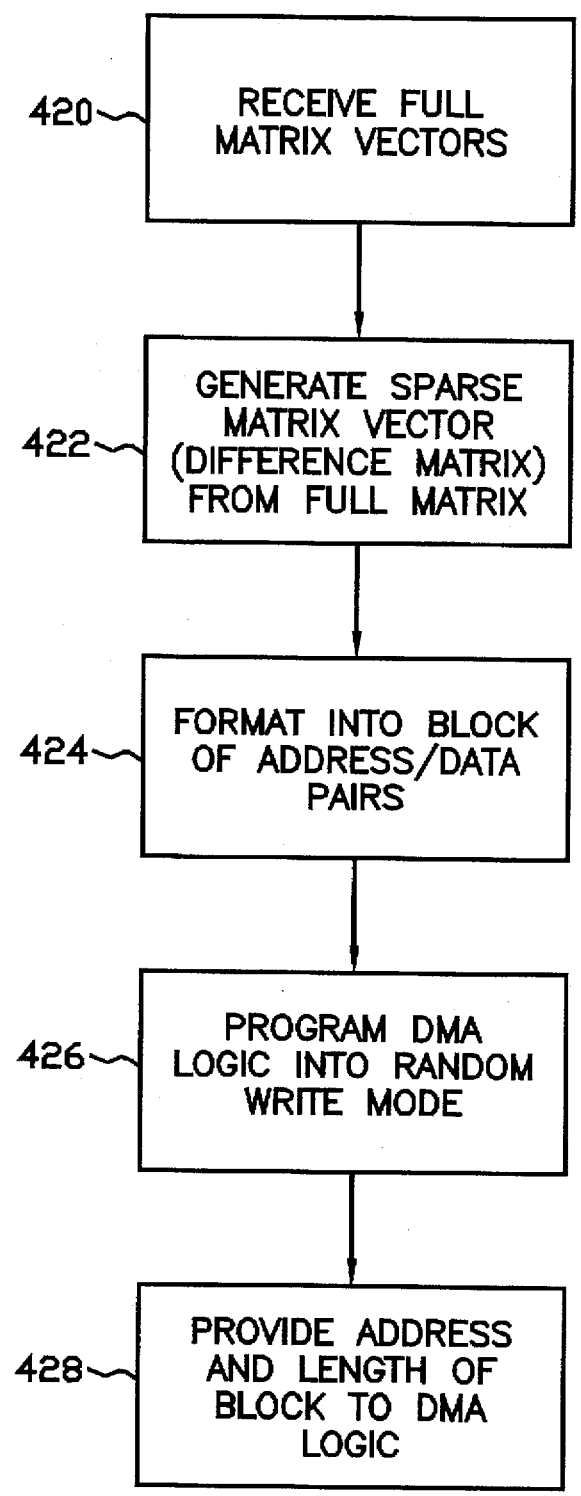
FIG. 7 is a flowchart diagram illustrating operation of the host computer generating a block of address/data pairs for random write operations.

Referring now to FIG. 7, a flowchart diagram illustrating operation of the host CPU 202 according to the preferred embodiment of the present invention is shown. In step 420, the host CPU 202 receives full matrix test vectors which control the tests desired to be performed by the instrumentation system. In step 422, the host CPU 202 generates a plurality of sparse matrix vectors where each sparse matrix vector comprises the differences between the respective vector and a prior vector.

Once the various sparse matrix vectors have been generated, the host CPU 202 in step 424 formats the plurality of sparse matrix vectors into a block of address/data pairs. The block is formatted so that the contents alternate address/data/address/data, etc. In the preferred embodiment, each of the address/data pairs comprises a 32-bit address and 32 bits of data. Thus, the address and data portions can be represented by a 64 bit packet. In an alternate embodiment, the address is 32 bits and the data is 8 bits. Alternatively, both the address and data are 16 bits. It is noted that any length address and any size of data may be used.

In step 426 the host CPU 202 programs the DMA transfer logic 220 into random write mode so that the random write engine 221 is enabled and the DMA transfer logic 220 is prepared to receive and handle the specially formatted block of address/data pairs. Programming the DMA transfer logic 220 into random write mode enables the random write engine 221 such that the DMA transfer logic 220 knows that the block of data to be transferred is formatted into address/data pairs. It should be noted that step 426 may be performed at any point before, during, or after steps 420–424, as desired. Finally, in step 428 the host CPU 202 provides the address of the block of address/data pairs and the length of the block to the DMA transfer logic 220.

Figure 8:
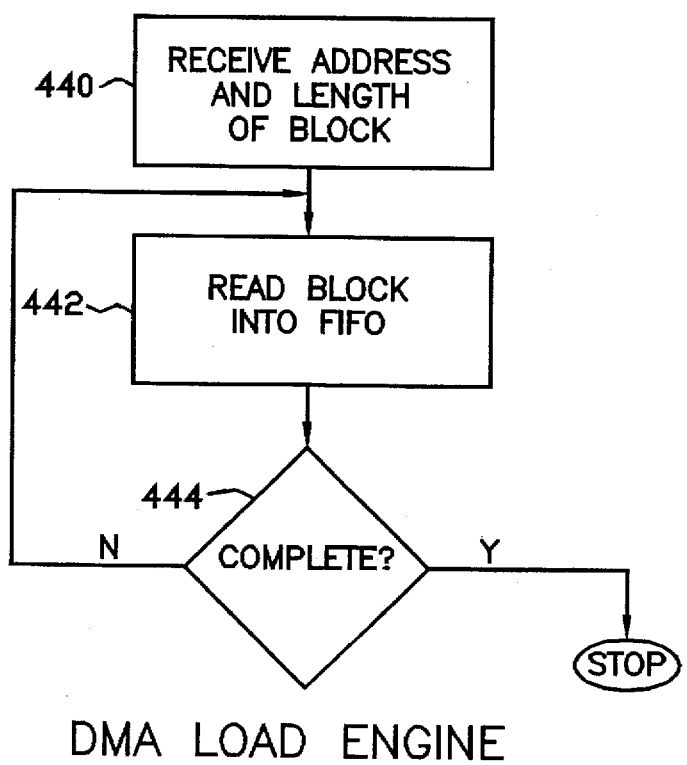
FIGS. 8 and 9 are flowchart diagrams illustrating operation of the DMA load engine and the DMA transfer engine in the random write engine of FIG. 6.

Referring now to FIG. 8, a flowchart diagram illustrating operation of the DMA load engine 404 in the random write engine 221 is shown. The DMA transfer logic 220 receives the address of the block of address/data pairs and the length of the block from the host CPU 202 in step 440. In step 442 the DMA load engine 404 reads the block of address/data pairs into the FIFO 402. The address/data pairs are preferably continually read into the FIFO 402 until transfer of the block is complete.

Figure 9:
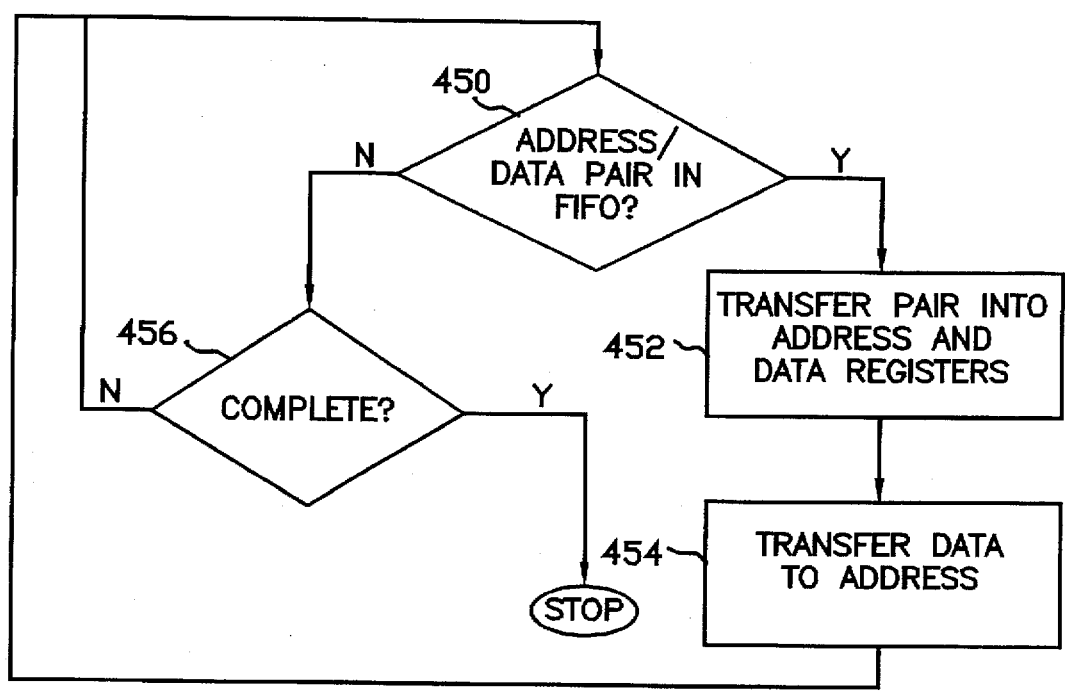

FIG. 9 is a flowchart diagram illustrating operation of the DMA transfer engine 410. After one or more address/data pairs have been stored in the FIFO 402 in step 450, the DMA transfer engine 410 performs the transfers. In step 450 the DMA transfer engine 410 determines if there are one or more address/data pairs in the FIFO 402. If not, then in step 456 the DMA transfer engine 410 determines in step 456 if operation has completed. If not, then operation returns to step 450. If one or more address/data pairs are in the FIFO 402 in step 450, then in step 452 the DMA transfer engine 410 transfers the address portion or element of the address/data pair at the head of the FIFO 402 into the address register 406 and transfers the corresponding data element into the data register 408. It is important that the random write engine 221 know the order that the address and data are stored in the FIFO 402 so that the latching signals operate correctly to store the address in the address register 406 and the data in the data register 408. It is not important whether an address is stored first or data is stored first, as long as the DMA transfer engine 410 knows the order. In step 454 the DMA transfer engine 410 transfers the data stored in the data register 408 to the respective instruments at the address contained in the address register 406. The DMA transfer engine repeats steps 452 and 454 as long as address/data pairs are stored in the FIFO 402, i.e., until the block of address/data pairs has been completely transferred, as shown in step 456.

In this manner, a large amount of small-sized data is rapidly transferred from a host computer to non-sequential addresses with minimal CPU involvement. The data is formatted into a block of address/data pairs which are stored sequentially in memory and the DMA transfer logic 220 is able to transfer this block very rapidly. Meanwhile the CPU 202 is only required to set up the address/data pairs in a block of memory, program the DMA transfer logic 226 into random write mode, and provide the address and length of the block to the DMA transfer logic 220.

It should be noted that the preferred embodiment comprise an instrumentation environment where the CPU 202 generates test vectors that control the attached instruments. However, the present invention may be operated in other systems, such as a video system, where it is sometimes necessary to transfer large amounts of small-sized data to non-contiguous or non-sequential addresses.

Although the method and apparatus of the present invention has been described in connection with the preferred embodiment, it is not intended to be limited to the specific form set forth herein, but on the contrary is intended to cover such alternatives, modifications, and equivalents as can be reasonably included within the spirit and scope of the invention as defined by the appended claims.

What is claimed is:

1. An instrumentation system, comprising:
  one or more instruments which perform operations based on received test vectors;
  a memory;
  a processor which creates a block of address/data pairs in response to said test vectors and stores said block of address/data pairs in said memory, wherein each of said address/data pairs comprises data and a destination address where said data is intended to be transferred, wherein, for each of said address/data pairs, said data and said destination address are stored together in said memory; and
  a random write engine coupled to said processor, said memory, and said one or more instruments, whereby said random write engine includes:
    a buffer which receives said block of address/data pairs from said memory; and
    a transfer engine coupled to said buffer for transferring data in each of said address/data pairs comprised in said block to one of said one or more instruments at the respective destination address contained in the address/data pair.

2. The instrumentation system of claim 1, wherein said random write engine further comprises:

an address register coupled to said buffer for storing a destination address of a respective address/data pair; and a data register coupled to said buffer for storing data of said respective address/data pair, wherein the transfer engine transfers the data in said data register to the destination address in said address register.

3. The instrumentation system of claim 2, wherein:

said address register includes an input for receiving a first latching signal;

said data register includes an input for receiving a second latching signal; and said first and second latching signals are alternately asserted to latch a destination address of a respective address/data pair from said buffer into said address register and to latch corresponding data from said respective address/data pair into said data register.

4. The instrumentation system of claim 1, wherein each of said address/data pairs comprises a 32 bit address and 32 bits of data.

5. The instrumentation system of claim 1, wherein said processor includes:

means for writing an address and length of said block of address/data pairs to said random write engine.

6. The instrumentation system of claim 1, wherein said processor includes:

means for receiving a plurality of test vectors;

means for generating a plurality of sparse matrix vectors in response to said received test vectors; and means for creating said block of address/data pairs in response to said plurality of sparse matrix vectors.

7. The instrumentation system of claim 1, further comprising:

direct memory access transfer logic coupled to said processor, said memory, and said one or more instruments, wherein said random write engine is comprised in said direct memory access transfer logic.

8. The instrumentation system of claim 7, wherein said processor further includes:

means for enabling said random write engine in said direct memory access transfer logic.

9. The instrumentation system of claim 8, wherein said means for enabling comprises means for programming said direct memory access transfer logic to random write mode.

10. The instrumentation system of claim 1, wherein said one or more instruments comprise pin drive electronics.

11. A method of transferring a plurality of test vectors to one or more instruments in an instrumentation system, comprising the steps of:

creating a block comprising a plurality of address/data pairs representing said plurality of test vectors to be transferred, wherein each of said address/data pairs comprise data and a corresponding destination address where said data is intended to be transferred;

storing said block of address/data pairs in memory, wherein, for each of said address/data pairs, said data and said destination address are stored together in the memory;

writing an address of said block of address/data pairs to a random write engine;

said random write engine transferring the data of each address/data pair to the corresponding destination address.

12. The method of claim 11, wherein said step of transferring comprises:

transferring the data of a respective address/data pair to a data register transferring the corresponding destination address of said respective address/data pair to an address register; and transferring the data comprised in said data register to said corresponding destination address;

wherein said random write engine repeats said steps of transferring the data to said data register, transferring the corresponding destination address to said address register, and transferring the data comprised in said data register to said corresponding destination address, for each of said address/data pairs in said block.

13. The method of claim 12, wherein said step of transferring the data to said data register is performed in response to assertion of a data latch signal, and said step of transferring the corresponding destination address to said address register is performed in response to assertion of an address latch signal;

wherein said data latch signal and said address latch signal are alternately asserted, wherein said step of transferring the data comprised in said data register to said corresponding destination address is performed after assertion of said address latch and data latch signals and after said steps of transferring the data to said data register and transferring the corresponding destination address to said address register.

14. The method of claim 11, wherein each of said address/data pairs comprises a 32 bit address and 32 bits of data.

15. The method of claim 11, further comprising the step of:

writing an address and length of said block of address/data pairs to said random write engine prior to said step of said random write engine transferring the data of each address/data pair to the corresponding destination address.

16. The method of claim 11, wherein said step of creating said block comprising said plurality of address/data pairs comprises:

receiving a plurality of test vectors;

generating a plurality of sparse matrix vectors in response to said received test vectors; and creating said block of address/data pairs in response to said plurality of sparse matrix vectors.

17. The method of claim 11, wherein the instrumentation system comprises a processor, memory coupled to said processor, one or more instruments coupled to the processor, and direct memory access transfer logic coupled to said processor, said memory, and said one or more instruments, wherein said random write engine is comprised in said direct memory access transfer logic, the method further comprising the step of:

enabling said random write engine, prior to said step of said random write engine transferring the data of each address/data pair to the corresponding destination address.

18. The method of claim 17, wherein said step of enabling comprises programming said direct memory access transfer logic to random write mode.

19. The method of claim 11, further comprising the step of:

storing said block of address/data pairs in a buffer after said step of writing said address of said block of address/data pairs to said random write engine.

* * * * *